(12) United States Patent
Kim

(10) Patent No.: US 11,237,079 B2
(45) Date of Patent: Feb. 1, 2022

(54) DEVICE FOR ANALYZING SENSITIVITY OF OBJECT USING FREQUENCY RESPONSE AND ANALYZING METHOD USING THE SAME

(71) Applicant: PUKYONG NATIONAL UNIVERSITY INDUSTRY-UNIVERSITY COOPERATION FOUNDATION, Busan (KR)

(72) Inventor: Chan Jung Kim, Busan (KR)

(73) Assignee: PUKYONG NATIONAL UNIVERSITY INDUSTRY-UNIVERSITY COOPERATION FOUNDATION, Busan (KR)

(*) Notice: Subject to any disclaimer, the term of this patent is extended or adjusted under 35 U.S.C. 154(b) by 72 days.

(21) Appl. No.: 16/778,829

(22) Filed: Jan. 31, 2020

(65) Prior Publication Data

US 2021/0172829 A1 Jun. 10, 2021

(30) Foreign Application Priority Data

Dec. 4, 2019 (KR) .......................... 10-2019-0159479

(51) Int. Cl.
  *G01M 7/02* (2006.01)
  *G01R 23/16* (2006.01)
(52) U.S. Cl.
  CPC ............ *G01M 7/025* (2013.01); *G01M 7/022* (2013.01); *G01R 23/16* (2013.01)

(58) Field of Classification Search
  CPC ........ G01M 7/025; G01M 7/022; G01R 23/16
  USPC ..................................... 73/663, 664
  See application file for complete search history.

(56) References Cited

U.S. PATENT DOCUMENTS

| 4,502,329 A | * | 3/1985 | Fukunaga | ................ G01N 3/32 |
| | | | | 73/573 |
| 2005/0092087 A1 | * | 5/2005 | Kurt-Elli | ............... G01M 7/025 |
| | | | | 73/579 |
| 2011/0146406 A1 | * | 6/2011 | Napolitano | ......... G01M 5/0066 |
| | | | | 73/583 |

FOREIGN PATENT DOCUMENTS

| KR | 101693310 | 1/2017 |
| KR | 102051746 | 12/2019 |

* cited by examiner

*Primary Examiner* — Lisa M Caputo
*Assistant Examiner* — Rose M Miller
(74) *Attorney, Agent, or Firm* — Norton Rose Fulbright US LLP

(57) ABSTRACT

A sensitivity analyzing device and method are disclosed. The device includes a vibration exciter to configure a vibration exciting pattern and apply a physical force to one face of a test object based on the pattern; a first sensor in contact with the one face of the test object to measure a physical force applied to the test object; a second sensor in contact with an opposite face of the test object to collect a vibration of the test object caused by the physical force; and a sensitivity analyzer configured to: control the vibration exciter to configure the vibration exciting pattern; convert the physical force signal measured by the first sensor and the vibration signal collected by the second sensor in responses to the vibration exciting pattern into frequency domain signals to calculate a frequency response function of the test object; and calculate a sensitivity index of the test object.

22 Claims, 13 Drawing Sheets

Summary of frequency response functions with CFRP specimen #1 (direction: 0°)

Summation of frequency response functions with CFRP specimen #2 (direction: 45°)

Summation of frequency response functions with CFRP specimen #3 (direction: 90°)

Variation of natural frequency over direction of carbon fiber. (a) First mode

Variation of natural frequency over direction of carbon fiber. (b) Second mode

Variation of damping ratio over direction of carbon fiber. (a) First mode

Variation of damping ratio over direction of carbon fiber. (b) Second mode

Scaled sensitivity index over the direction of carbon fiber in the first mode. (a) Random (b) Harmonic Scaled sensitivity index over the direction of carbon fiber in the second mode. (a) Random (b) Harmonic Scaled sensitivity index over the spectral loading pattern in the first mode Scaled sensitivity index of damping ratio in the second mode

DEVICE FOR ANALYZING SENSITIVITY OF OBJECT USING FREQUENCY RESPONSE AND ANALYZING METHOD USING THE SAME

CROSS-REFERENCE TO RELATED APPLICATION

This application claims a benefit under 35 U.S.C. § 119(a) of Korean Patent Application No. 10-2019-0159479 filed on Dec. 4, 2019. The contents of the referenced patent application are incorporated into the present application by reference.

BACKGROUND

1. Field

The present disclosure relates to a sensitivity analyzing device using a frequency response and a sensitivity analyzing method using the same. More specifically, the present disclosure relates to a sensitivity analyzing device using a frequency response and a sensitivity analyzing method using the same, in which a frequency response of an object having an orientation in an internal structure is identified to analyze physical properties of the object.

2. Description of Related Art

A composite material refers to combination of different kinds of materials and has properties that may not be obtained from a single material. Unlike a single material, the composite material may not be uniform in terms of a microstructure and may not be continuous and may have multiphases. The composite material may be largely divided into particle reinforced materials, fiber reinforced materials, and structural composite materials.

The composite material has physical or chemically enhanced properties compared to the single material. The composite material may be lightweight and may be durable. For example, FRP (Fiber Reinforced Plastic) is light and durable, and is expected to be used in applications requiring lightweight materials as in aerospace and automotive applications.

However, physical properties of the composite material may be greatly affected by a structure of the material and a type of material. When manufacturing a product with the composite material, a designer should use the composite material with physical properties that meet requirements of the final product. During a design process, the physical properties of the composite material should be checked.

A prior art released to the present disclosure includes Korea Patent Application Publication No. 10-2018-0091873 (published on Aug. 16, 2018).

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

A purpose of the present disclosure is to provide a sensitivity analyzing device using a frequency response and a sensitivity analyzing method using the same to analyze physical properties of an object having an orientation in an internal structure in consideration of the orientation of the object.

Another purpose of the present disclosure is to provide a sensitivity analyzing device using a frequency response and a sensitivity analyzing method using the same to calculate a sensitivity of an object having an orientation in an internal structure based on not only the orientation but also various external force patterns, such that a product designer may predict a product performance in advance.

Purposes in accordance with the present disclosure are not limited to the above-mentioned purpose. Other purposes and advantages in accordance with the present disclosure as not mentioned above may be understood from following descriptions and more clearly understood from embodiments in accordance with the present disclosure. Further, it will be readily appreciated that the purposes and advantages in accordance with the present disclosure may be realized by features and combinations thereof as disclosed in the claims.

A first aspect of the present disclosure provides a sensitivity analyzing device using frequency response, the device comprising: a vibration exciter configured to configure a vibration exciting pattern and apply a physical force to one face of a test object based on the vibration exciting pattern; a first sensor in contact with the one face of the test object to measure a physical force applied to the test object by the vibration exciter; a second sensor in contact with an opposite face of the test object to the one face to collect a vibration of the test object caused by the physical force; and a sensitivity analyzer configured to: control the vibration exciter to configure the vibration exciting pattern; convert the physical force signal measured by the first sensor and the vibration signal collected by the second sensor in responses to the vibration exciting pattern into frequency domain signals to calculate a frequency response function of the test object; and calculate a sensitivity index of the test object to a variation in a physical external force, based on the frequency response function.

In one implementation of the first aspect, the vibration exciter is configured to apply the physical force based on at least two vibration exciting patterns, wherein the at least two vibration exciting pattern include a random pattern and a harmonic pattern having the same frequency band.

In one implementation of the first aspect, the vibration exciter includes an actuator, an electrodynamic shaker or an impact hammer.

In one implementation of the first aspect, the first sensor includes a load sensor positioned between the vibration exciter and the test object to measure the physical force.

In one implementation of the first aspect, the second sensor includes an acceleration sensor, wherein the second sensor includes a plurality of second sensors mounted on the opposite face of the test object to collect vibrations at a plurality of positions thereon.

In one implementation of the first aspect, the test object is made of a material having a single orientation of a predefined angle.

In one implementation of the first aspect, the test object is made of a carbon fiber reinforced plastic (CFRP) having carbon fibers as a reinforced material.

In one implementation of the first aspect, the sensitivity analyzer is configured to calculate the frequency response function based on a frequency spectrum pattern of the physical force applied to the test object and the orientation angle of the material thereof.

In one implementation of the first aspect, the sensitivity analyzer is configured to calculate the frequency response function using a following Equation 1:

$$H(\omega, \theta, p) = \sum_{i=1}^{N} \frac{R_i^e}{-\omega^2 + 2\omega_{n,i}(\theta)\omega\xi_i(\theta, p)j + \omega_{n,i}(\theta)^2} \quad \text{[Equation 1]}$$

where $H(\omega, \theta, p)$ denotes the frequency response function, $\theta$ denotes the orientation angle, p denotes the frequency spectrum pattern, $\omega_{n,i}(\theta)$ denotes a resonance frequency, $\xi_i(p, \theta)$ denotes a damping ratio, $R_i^e$ denotes an i-th mode residue, and co denotes a frequency ($=2\pi f$).

In one implementation of the first aspect, the sensitivity analyzer is configured to calculate a sensitivity index based on a frequency spectrum pattern of the physical force applied to the test object and a sensitivity index based on the orientation angle.

In one implementation of the first aspect, the sensitivity analyzer is configured to calculate the sensitivity index based on the frequency spectrum pattern of the physical force based on a following Equation 2:

$$I_{p,i}(k) = \left|\frac{0.5}{H(\omega, \theta, p)} \frac{\partial(H(\omega, \theta, p))}{\partial p}\right| = \left|\omega\omega_{n,i}(\theta)\frac{\partial(\xi_i(\theta, p))}{\partial p}\right| \quad \text{[Equation 2]}$$

where p denotes the frequency spectrum pattern, and $I_{p,i}(k)$ denotes the sensitivity index based on the frequency spectrum pattern for an i-th mode frequency response function of a k-th test object specimen.

In one implementation of the first aspect, the sensitivity analyzer is configured to calculate the sensitivity index based on the angle using a following Equation 3:

$$I_{\theta,i}(k) = \left|\frac{0.5}{H(\omega, \theta, p)} \frac{\partial(H(\omega, \theta, p))}{\partial p}\right| = \left|\omega_{n,i}(\theta)\frac{\partial(\omega_{n,i}(\theta))}{\partial \theta} + \omega\left(\xi_i(\theta, p)\frac{\partial(\omega_{n,i}(\theta))}{\partial \theta} + \omega_{n,i}(\theta)\frac{\partial(\xi_i(\theta, p))}{\partial \theta}\right)j\right| \quad \text{[Equation 3]}$$

where $\theta$ denotes the orientation angle and $I_{\theta,i}(k)$ denotes the sensitivity index based on the angle for an i-th mode frequency response function of a k-th test object specimen.

In one implementation of the first aspect, the sensitivity analyzer is configured to: calculate a first sensitivity index of each of at least two test objects having different orientation angles of the material, based on a frequency spectrum pattern of the physical force applied thereto; calculate a second sensitivity index of each of the at least two test objects, based on the orientation angle; and calculate first and second scaled sensitivity indexes of each of the at least two test objects, based on the first and second sensitivity indexes of each test object respectively.

In one implementation of the first aspect, the sensitivity analyzer is configured to calculate the first and second scaled sensitivity indexes of each test object based on a following Equation 4:

$$\tilde{I}_{\theta,i} = \frac{I_{\theta,i}(k)}{\sum_{k=1}^{3} I_{\theta,i}(k)} \quad \text{[Equation 4]}$$

$$\tilde{I}_{p,i} = \frac{I_{p,i}(k)}{\sum_{k=1}^{3} I_{p,i}(k)}$$

where $\theta$ denotes the orientation angle, p denotes the frequency spectrum pattern, $\tilde{I}_{\theta,i}$ denotes the second scaled sensitivity index based on the angle $\theta$, and $\tilde{I}_{p,i}$ denotes the first scaled sensitivity index based on the frequency spectrum p.

A second aspect of the present disclosure provides a sensitivity analyzing method using frequency response, the method comprising: configuring, by a vibration exciter, a vibration exciting pattern under control thereof by a sensitivity analyzer; applying, by the vibration exciter, a physical force to one face of a test object based on the vibration exciting pattern; measuring, by a first sensor, a physical force applied to the test object by the vibration exciter; collecting, by a second sensor, a vibration of the test object caused by the physical force; converting, by the sensitivity analyzer, the physical force signal measured by the first sensor and the vibration signal collected by the second sensor in responses to the vibration exciting pattern into frequency domain signals to calculate a frequency response function of the test object; and calculating, by the sensitivity analyzer, a sensitivity index of the test object to a variation in a physical external force, based on the frequency response function.

In one implementation of the second aspect, applying the physical force includes applying the physical force based on at least two vibration exciting patterns, wherein the at least two vibration exciting pattern include a random pattern and a harmonic pattern having the same frequency band.

In one implementation of the second aspect, the test object is made of a material having a single orientation of a predefined angle.

In one implementation of the second aspect, calculating the frequency response function includes calculating the frequency response function based on a frequency spectrum pattern of the physical force applied to the test object and the orientation angle of the material thereof.

The sensitivity analyzing method of claim 18, wherein calculating the frequency response function includes calculating the frequency response function using a following Equation 1.

$$H(\omega, \theta, p) = \sum_{i=1}^{N} \frac{R_i^e}{-\omega^2 + 2\omega_{n,i}(\theta)\omega\xi_i(\theta, p)j + \omega_{n,i}(\theta)^2} \quad \text{[Equation 1]}$$

where $H(\omega, \theta, p)$ denotes the frequency response function, $\theta$ denotes the orientation angle, p denotes the frequency spectrum pattern, $\omega_{n,i}(\theta)$ denotes a resonance frequency, $\xi_i(p, \theta)$ denotes a damping ratio, $R_i^e$ denotes an i-th mode residue, and w denotes a frequency ($=2\pi f$).

In one implementation of the second aspect, calculating the sensitivity index includes calculating a sensitivity index based on a frequency spectrum pattern of the physical force applied to the test object and a sensitivity index based on the orientation angle.

In one implementation of the second aspect, calculating the sensitivity index based on the frequency spectrum pattern of the physical force includes calculating the sensitivity index based on the frequency spectrum pattern of the physical force based on a following Equation 2:

$$I_{p,i}(k) = \left| \frac{0.5}{H(\omega, \theta, p)} \frac{\partial(H(\omega, \theta, p))}{\partial p} \right| = \left| \omega \omega_{n,i}(\theta) \frac{\partial(\xi_i(\theta, p))}{\partial p} \right| \quad \text{[Equation 2]}$$

where p denotes the frequency spectrum pattern, and $I_{p,i}(k)$ denotes the sensitivity index based on the frequency spectrum pattern for an i-th mode frequency response function of a k-th test object specimen.

In one implementation of the second aspect, calculating the sensitivity index based on the angle includes calculating the sensitivity index based on the angle using a following Equation 3:

$$I_{\theta,i}(k) = \left| \frac{0.5}{H(\omega, \theta, p)} \frac{\partial(H(\omega, \theta, p))}{\partial p} \right| = \left| \omega_{n,i}(\theta) \frac{\partial(\omega_{n,i}(\theta))}{\partial \theta} + \omega \left( \xi_i(\theta, p) \frac{\partial(\omega_{n,i}(\theta))}{\partial \theta} + \omega_{n,i}(\theta) \frac{\partial(\xi_i(\theta, p))}{\partial \theta} \right) j \right| \quad \text{[Equation 3]}$$

where θ denotes the orientation angle and $I_{\theta,i}(k)$ denotes the sensitivity index based on the angle for an i-th mode frequency response function of a k-th test object specimen.

In one implementation of the second aspect, the method further comprises: calculating a first sensitivity index of each of at least two test objects having different orientation angles of the material, based on a frequency spectrum pattern of the physical force applied thereto; calculating a second sensitivity index of each of the at least two test objects, based on the orientation angle; and calculating first and second scaled sensitivity indexes of each of the at least two test objects, based on the first and second sensitivity indexes of each test object respectively.

In one implementation of the second aspect, calculating the first and second scaled sensitivity indexes of each of the at least two test objects includes calculating the first and second scaled sensitivity indexes of each test object based on a following Equation 4:

$$\tilde{I}_{\theta,i} = \frac{I_{\theta,i}(k)}{\sum_{k=1}^{3} I_{\theta,i}(k)} \quad \text{[Equation 4]}$$

$$\tilde{I}_{p,i} = \frac{I_{p,i}(k)}{\sum_{k=1}^{3} I_{p,i}(k)}$$

where θ denotes the orientation angle, p denotes the frequency spectrum pattern, $\tilde{I}_{\theta,i}$ denotes the second scaled sensitivity index based on the angle θ, and $\tilde{I}_{p,i}$ denotes the first scaled sensitivity index based on the frequency spectrum p.

Effects in accordance with the present disclosure may be as follows but may not be limited thereto.

The sensitivity analyzing device using the frequency response and the sensitivity analyzing method using the same in accordance with the present disclosure may more accurately analyze the physical properties of the object having the orientation in an internal structure in consideration of the orientation of the object.

Further, the sensitivity analyzing device using the frequency response and the sensitivity analyzing method using the same in accordance with the present disclosure may calculate the sensitivity of the object having the orientation in an internal structure based on not only the orientation but also the various external force patterns, such that a product designer may predict a product performance in advance.

In addition to the effects as described above, specific effects in accordance with the present disclosure will be described together with the detailed description for carrying out the disclosure.

DETAILED DESCRIPTIONS

Figure 1:
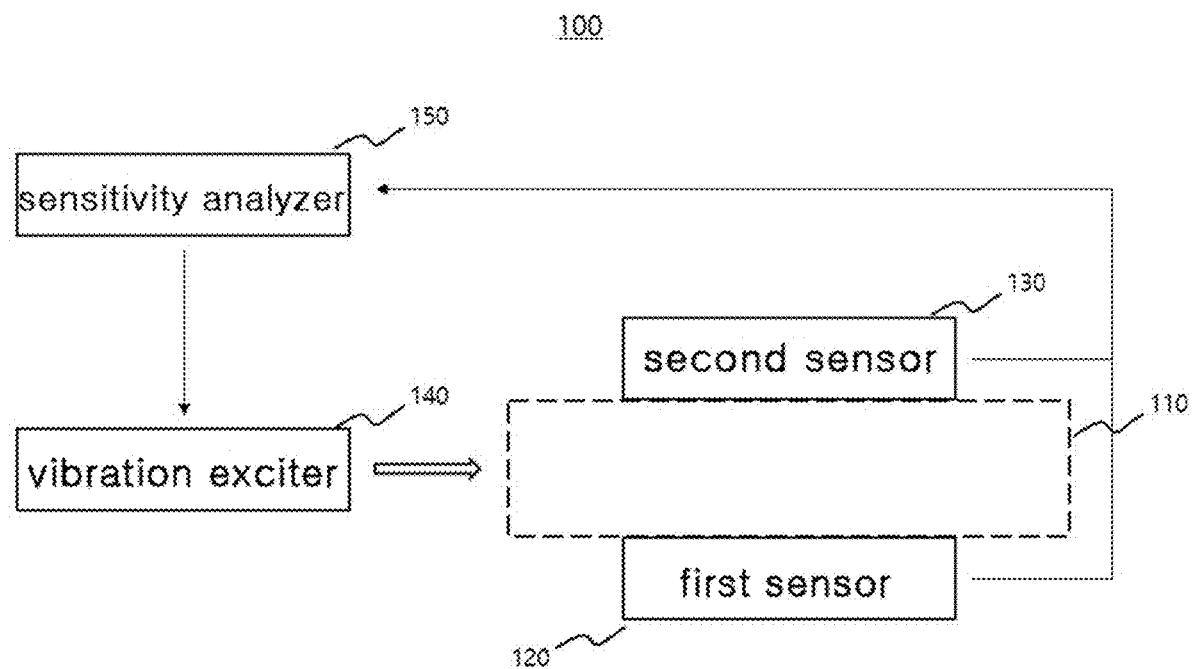
FIG. 1 is a block diagram showing a configuration of a sensitivity analyzing device using a frequency response in accordance with an embodiment of the present disclosure.

For simplicity and clarity of illustration, elements in the figures are not necessarily drawn to scale. The same reference numbers in different figures denote the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, specific embodiments for carrying out a sensitivity analyzing device using a frequency response and a sensitivity analyzing method using the same in accordance with the present disclosure are as follows.

FIG. 1 is a block diagram showing a configuration of a sensitivity analyzing device using a frequency response in accordance with an embodiment of the present disclosure.

Referring to FIG. 1, a sensitivity analyzing device 100 using a frequency response may include a first sensor 120, a second sensor 130, a vibration exciter 140, and a sensitivity analyzer 150.

The sensitivity analyzing device 100 using the frequency response may calculate a frequency response function with considering not only an orientation in an internal structure of a test object 110 but also various external force patterns. Then, the sensitivity analyzing device 100 may calculate a sensitivity index of the test object 110 to a variation in a physical external force, based on the calculated frequency response function. The calculated sensitivity index may allow an user to comparing physical properties of various test objects with each other.

The test object 110 may refer to a target object whose sensitivity is to be analyzed. The test object 110 may be a specimen made of a material to be tested and may be a component composed of a test material. In an embodiment, the test object 110 may be an object made of a material having one orientation of a specific angle, for example, a composite material.

For example, the test object 110 may include CFRP (Carbon Fiber Reinforced Plastic) which uses carbon fibers as a reinforcing material. Mechanical properties of the carbon fiber reinforced plastic may be influenced by conditions of the carbon fiber and polymer resin constituting the CFRP and a layered structure of the carbon fiber therein. In particular, a direction or an orientation of the carbon fiber as a reinforcing material plays a big role in determining the physical properties of the carbon fiber reinforced plastic. Thus, the carbon fiber reinforced plastics should be designed with taking into account a principal direction of an external force.

Hereinafter, for convenience of illustration, it will be assumed that the carbon fiber reinforced plastic specimen is employed as the test object 110.

In one embodiment, the test object 110 may be placed at a test position using an automatic transport device (not shown) and may be fixed at the test position using a jig.

The first sensor 120 may be in contact with one face of the test object 110 and may measure a physical force applied to the test object 110 by the vibration exciter 140. The first sensor 120 may transmit the measured value to the sensitivity analyzer 150. In an embodiment, the first sensor 120 may be positioned between the vibration exciter 140 and the test object 110 to measure the physical force applied to the test object 110 by the vibration exciter 140. In an embodiment, the first sensor 120 may be disposed on and in contact with the vibration exciter 140, and the test object 110 may be disposed on and in contact with the first sensor 120. The first sensor 120 may include a load sensor.

The second sensor 130 may be in contact with an opposite face of the test object 110 and may collects vibration of the test object 110 caused by the physical force. In one embodiment, the second sensor 30 may include an acceleration sensor that measures an acceleration displacement of the test object 110. In another embodiment, the second sensor may include a displacement sensor measuring a displacement of the test object 110 or a velocity sensor measuring a velocity thereof.

There may be a slight difference between the measured values collected by the second sensor depending on a vibration collection position. When using the values measured at a multiple of positions using the multiple of sensors, more accurate measurement may be made. In one embodiment, when placing a plurality of second sensors 130 at a plurality of positions on the opposite face of the test object 110, each vibration at each point may be collected by each second sensor 130.

Figure 2:
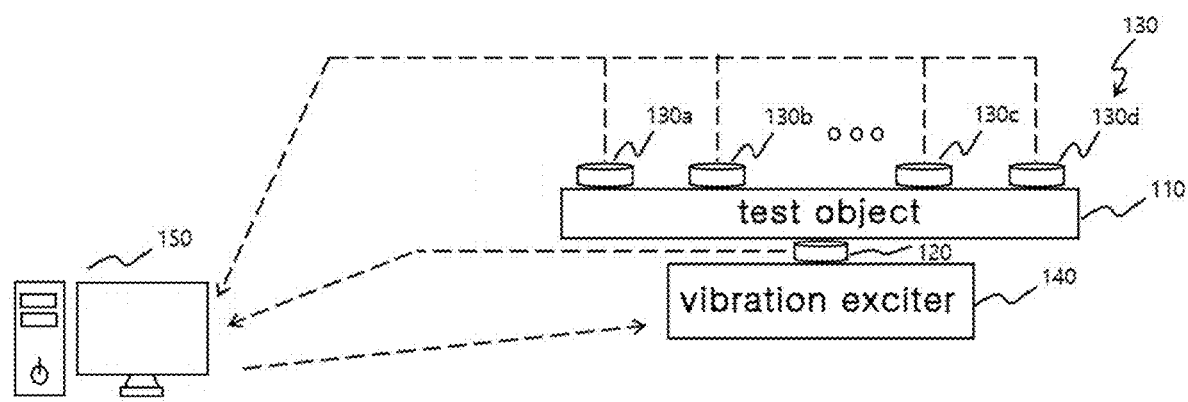
FIG. 2 is a schematic diagram showing a configuration of a sensitivity analyzing device including a plurality of sensors by way of example FIG. 3 schematically shows a test object

FIG. 2 is an exemplary configuration diagram showing a configuration of a sensitivity analyzing device including a plurality of sensors.

Referring to FIG. 2, a sensitivity analyzing device 200 using a frequency response may include the first sensor 120, the second sensor 130, the vibration exciter 140, and the sensitivity analyzer 150. A remaining configuration except for a configuration using the plurality of second sensors 130 is the same as in FIG. 1.

The plurality of second sensors 130a, 130b, 130c, 130d, . . . may be positioned at preset positions respectively. The positions may be determined by a user. Each of the plurality of second sensors 130a, 130b, 130c, 130d, . . . may collect each vibration at each corresponding position and send the collected data to the sensitivity analyzer 150.

Referring back to FIG. 1, the vibration exciter 140 may configure a vibration exciting pattern under control of the sensitivity analyzer 150 and may apply a physical force to one face of the test object 110 based on the vibration exciting pattern. In one embodiment, the vibration exciter 140 may apply the physical force to the test object 110 based on varying vibration exciting patterns. The vibration exciter 110 may include a uniaxial vibration exciter for applying a force in one axial direction, a biaxial vibration exciter for applying a force in two axial directions, a triaxial vibration exciter for applying a force in three axial directions, and the like. In a following description, it may be assumed that the uniaxial vibration exciter is used as the vibration exciter 140 for convenience of illustration. For example, the vibration exciter 140 may include an electrodynamic shaker or an actuator that vibrates the object by applying an force to the object in one axis direction.

The vibration exciter 140 may apply the physical force to the test object 110 based on at least two or more vibration exciting patterns under control of the sensitivity analyzer 150. In one embodiment, the vibration exciting pattern may include a random pattern and a harmonic pattern having the same frequency band. The random pattern may refer to a pattern including a plurality of random frequency signals. The harmonic pattern may refer to a pattern including a sinusoidal signal of a fundamental frequency.

In another embodiment, a fixed impact device (e.g., an impact hammer) capable of automatically applying an impact to the test object 110 may be used as the vibration exciter 140. The impact hammer does not cause a physical damage to the test object 110. When using the impact hammer, no pre-processing may be required for testing. The impact may be applied to the test object 110 over a wide frequency. The impact hammer may have a tip provided at an actual impact part to the object.

Hereinafter, for convenience of illustration, it will be assumed that the electrodynamic shaker is used as the vibration exciter 140. The electrodynamic shaker may precisely control a vibration exciting frequency and a vibration exciting pattern, resulting in highly reliable results even in repeated tests.

The sensitivity analyzer 150 may control the vibration exciter 140 to configure the vibration exciting pattern. The sensitivity analyzer 150 may convert a physical force signal measured by the first sensor 120 and a vibration signal collected by the second sensor 130 in response to the vibration exciting pattern into frequency domain signals to calculate the frequency response function of the test object 110. The sensitivity analyzer 150 may calculate a sensitivity index of the test object 110 to the variation in a physical external force based on the frequency response function. When assuming that the test object 110 is a linear system, an analysis method using the frequency response function may be one of efficient methods for analyzing the physical properties of the corresponding test object.

Hereinafter, a process in which the sensitivity analyzer 150 may calculate the frequency response function and calculates the sensitivity index based on the frequency response function will be described in detail.

When the external physical force is F, a 1-DOF (Degree of Freedom) linear model expression of the test object 110 may be expressed as a following Equation 5:

$$m\ddot{x} + c\dot{x} + kx = F \qquad \text{[Equation 5]}$$

where m is a mass of the test object, c is a damping coefficient, k is a stiffness coefficient, F is a externally applied physical force, and x is a displacement of the test object 110 caused by the external force.

A resonance frequency or a natural frequency of the test object 110 calculated based on the above Equation 5 may be expressed by a following Equation 6, and a damping ratio of the test object 110 may be expressed by a following Equation 7:

$$\omega_d = \omega_n \sqrt{(1-\xi^2)}, \; \omega_n = \sqrt{\frac{k}{m}} \qquad \text{[Equation 6]}$$

where $\omega_n$ denotes a resonance frequency and $\xi$ denotes a damping ratio.

$$\xi = \frac{c}{2\sqrt{mk}} \qquad \text{[Equation 7]}$$

where $\omega_n$ is a resonance frequency, and $\xi$ is a damping ratio.

A following Equation 8 is a formula obtained by mass-normalizing the above Equation 5 as a 1 degree-of-freedom (1-DOF) linear model expression to extend the expression to a modal coefficient. The obtained formula is expressed using a resonance frequency and a damping ratio:

$$\ddot{x} + 2\omega_n \xi \dot{x} + \omega_n^2 x = f, \; f(t) = \frac{F}{m} \qquad \text{[Equation 8]}$$

When the above Equation 8 is expressed as a general modal expression of N degree-of-freedom (N-DOF), the modal expression may be expressed as a determinant of a following Equation 9:

$$\begin{bmatrix} 1 & & zeros \\ & \ddots & \\ zeros & & 1 \end{bmatrix} \ddot{X} = \begin{bmatrix} 2\omega_{n,1}\xi_1 & & zeros \\ & \ddots & \\ zeros & & 2\omega_{n,N}\xi_N \end{bmatrix}$$

$$\dot{X} + \begin{bmatrix} \omega_1^2 & & zeros \\ & \ddots & \\ zeros & & \omega_N^2 \end{bmatrix} X = \begin{bmatrix} F_1 \\ \vdots \\ F_N \end{bmatrix}$$

[Equation 9]

where $\omega_{n,i}$ is an i-th mode resonance frequency, $\xi_i$ is an i-th mode damping ratio, $F_i$ is an i-th mode external force, and $X = [x_1, x_2, \ldots, x_N]^T$ (modal coordinate column vector).

In a single input condition (Fi=0, except i≠j), a frequency response function of Fj may be expressed by a following Equation 10:

$$\frac{R(\omega)}{Fj(\omega)} = H(\omega) = \sum_{i=1}^{N} \frac{R_i^e}{-\omega^2 + 2\omega_{n,i}\omega\xi_i j + \omega_{n,i}^2}$$

[Equation 10]

where $H(\omega)$ is the frequency response function, $R(\omega)$ is a value obtained by converting an output (x) value to a frequency domain, $Fj(\omega)$ is a value obtained by converting an input (F) value to the frequency domain, $R_i^e$ is an i-th mode residue, and $\omega$ is a frequency ($=2\pi f$).

The residue is negligibly small compared to the input value (the external force, $Fj(\omega)$), and, thus, the frequency response function is affected by $\omega_{n,i}$ and $\xi_i$.

For convenience of illustration, it is assumed that the test object 110 is a composite material having one orientation of a specific angle, for example, a carbon fiber reinforced plastic specimen.

In the carbon fiber reinforced plastic, the carbon fibers may be arranged to have one orientation. Depending on the orientation (or direction) of the carbon fiber, the physical properties of the composite material (e.g., a strength) may vary.

Figure 3:
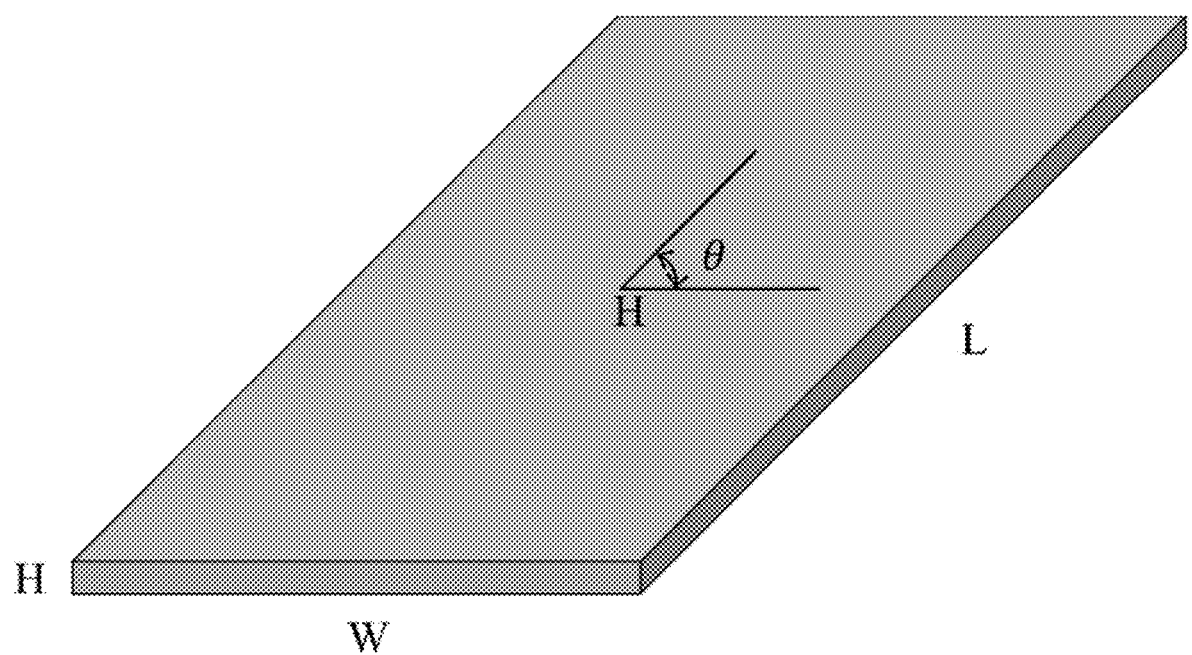

FIG. 3 is a schematic diagram of a test object.

Referring to FIG. 3, the test object has a length L, a width W, and a height H. It is assumed that one orientation in the material has an angle θ in the height H direction. For example, it is assumed that in the carbon fiber reinforced plastic, the carbon fibers are oriented at the angle θ in the height direction.

When the mass of the test object is constant, the resonance frequency may be varied based on the stiffness coefficient k. The resonance frequency $\omega_{n,i}$ may be expressed as $\omega_{n,i}(\theta)$ in consideration of the direction of the carbon fiber. Further, the damping ratios $\xi_i$ may be expressed as $\xi_i(p, \theta)$ with considering a type of a frequency spectrum pattern of the input physical force and the direction of the carbon fiber. In this connection, p is the frequency spectrum pattern of the input physical force, and θ is an angle at which the material is oriented.

The values of $\omega_{n,i}(\theta)$ and $\xi_i(p, \theta)$ may be obtained via testing the test object 110. For example, a damped resonance frequency or a damped natural frequency may be obtained at an i-th peak point of the measured frequency response function. When frequency values of both points at which each of energy values is equal to an half of an energy value of the damped resonance frequency around the damped resonance frequency are assumed to be ω(1) d,i, and ω(2) d,i, respectively, $\xi_i(p, \theta)$ may be expressed by a following Equation 11:

$$\xi_i(p, \theta) = \frac{|\omega_{d,i}^{(2)} - \omega_{d,i}^{(1)}|}{2\omega_{d,i}},$$

[Equation 11]

where $\omega_{d,i}$ denotes a damped resonance frequency.

The resonance frequency $\omega_{n,i}(\theta)$ may be obtained using the above Equation 11 and Equation 6.

The sensitivity analyzer 150 may calculate the frequency response function based on the frequency spectrum pattern p of the physical force applied to the test object and the oriented angle θ of the material. As described above, the sensitivity analyzer 150 may obtain values of $\omega_{n,i}(\theta)$ and $\xi_i(p, \theta)$ using the above Equation 11 and Equation 6. Then, the sensitivity analyzer 150 may calculate the frequency response function of the test object 110 based on the frequency spectrum pattern p and the oriented angle θ of the material using a following Equation 1 below:

$$H(\omega, \theta, p) = \sum_{i=1}^{N} \frac{R_i^e}{-\omega^2 + 2\omega_{n,i}(\theta)\omega\xi_i(\theta, p)j + \omega_{n,i}(\theta)^2}$$

[Equation 1]

The sensitivity analyzer 150 may calculate a sensitivity index based on the frequency spectrum pattern p of the physical force applied to the test object 110 and a sensitivity index based on the angle θ.

The sensitivity analyzer 150 may perform a partial derivatives on the frequency response function of the above Equation 1 using the frequency spectrum pattern p and the angle θ as variables. A following Equation 12 represents a partial derivative based on the angle θ, while a following Equation 13 represents a partial derivative based on the frequency spectrum pattern p:

$$\frac{\partial(H(\omega, \theta, p))}{\partial \theta} = \sum_{i=1}^{N} \frac{-2R_i^e}{|\omega^2 + 2\omega_{n,i}(\theta)\omega\xi_i(\theta, p)j + \omega_{n,i}(\theta)^2|^2}$$

$$\left\{ (\omega\xi_i(\theta, p)j + \omega_{n,i}(\theta)) \frac{\partial(\omega_{n,i}(\theta))}{\partial \theta} + \omega\omega_{n,i}(\theta)j \frac{\partial(\xi_i(\theta, p))}{\partial \theta} \right\}$$

[Equation 12]

$$\frac{\partial(H(\omega, \theta, p))}{\partial p} =$$

$$\sum_{i=1}^{N} \frac{-2R_i^e}{|-\omega^2 + 2\omega_{n,i}(\theta)\omega\xi_i(\theta, p)j + \omega_{n,i}(\theta)^2|^2}$$

$$\left\{ \omega\omega_{n,i}(\theta)j \frac{\partial(\xi_i(\theta, p))}{\partial p} \right\}$$

[Equation 13]

The sensitivity analyzer 150 may calculate the sensitivity index based on the angle θ using the above Equation 12. A following Equation 3 represents the sensitivity index based on the angle θ for an i-th mode frequency response function of a k-th test object specimen:

$$I_{\theta,i}(k) = \left|\frac{0.5}{H(\omega,\theta,p)}\frac{\partial(H(\omega,\theta,p))}{\partial\theta}\right| = \left|\omega_{n,i}(\theta)\frac{\partial(\omega_{n,i}(\theta))}{\partial\theta} + \omega\left(\xi_i(\theta,p)\frac{\partial(\omega_{n,i}(\theta))}{\partial\theta} + \omega_{n,i}(\theta)\frac{\partial(\xi_i(\theta,p))}{\partial\theta}\right)j\right|$$ [Equation 3]

where $I_{\theta,i}(k)$ denotes the sensitivity index based on the angle θ for the i-th mode frequency response function of the k-th test object specimen.

Further, the sensitivity analyzer 150 may calculate the sensitivity index based on the frequency spectrum pattern p of the physical force applied to the test object 110 using the above Equation 13. A following Equation 2 represents the sensitivity index based on the frequency spectrum pattern p for the i-th mode frequency response function of the k-th test object specimen.

$$I_{p,i}(k) = \left|\frac{0.5}{H(\omega,\theta,p)}\frac{\partial(H(\omega,\theta,p))}{\partial\theta}\right| = \left|\omega\omega_{n,i}(\theta)\frac{\partial(\xi_i(\theta,p))}{\partial p}\right|$$ [Equation 2]

where $I_{p,i}(k)$ denotes the sensitivity index based on the frequency spectrum pattern p for the i-th mode frequency response function of the k-th test object specimen.

When the sensitivity index is calculated for each of the plurality of test objects 110, the sensitivity analyzer 150 may calculate a scaled sensitivity index for each test object.

The sensitivity analyzer 150 may calculate the sensitivity index based on the frequency spectrum pattern p and the sensitivity index based on the angle θ for at least two test objects having different orientation angles θ of the material and may calculate the scaled sensitivity index for each test object based on each sensitivity index calculated for each test object.

A following Equation 4 represents the scaled sensitivity index for the i-th mode frequency response function of the k-th test object specimen $$\tilde{I}_{\theta,i} = \frac{I_{\theta,i}(k)}{\sum_{k=1}^{3} I_{\theta,i}(k)}$$ [Equation 4]

$$\tilde{I}_{p,i} = \frac{I_{p,i}(k)}{\sum_{k=1}^{3} I_{p,i}(k)}$$

where $\tilde{I}_{\theta,i}$ denotes a scaled sensitivity index based on an angle θ, and $\tilde{I}_{p,i}$ denotes a scaled sensitivity index based on a frequency spectrum pattern p.

Hereinafter, empirically implementing the sensitivity analyzing device using the frequency response as exemplified above and experimental results therefrom will be described.

Figure 4A:
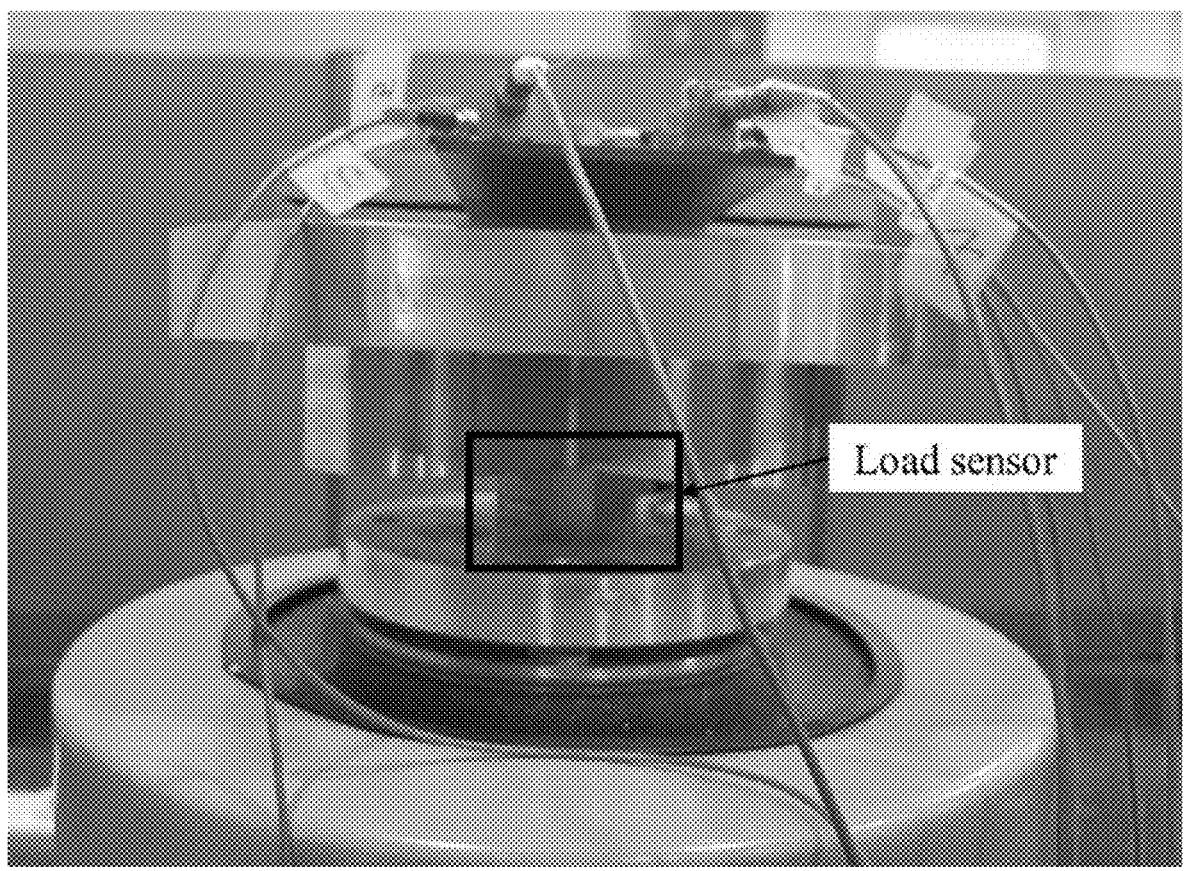
FIG. 4A and FIG. 4B show examples of an experimental configuration of a sensitivity analyzing device.
Figure 4B:
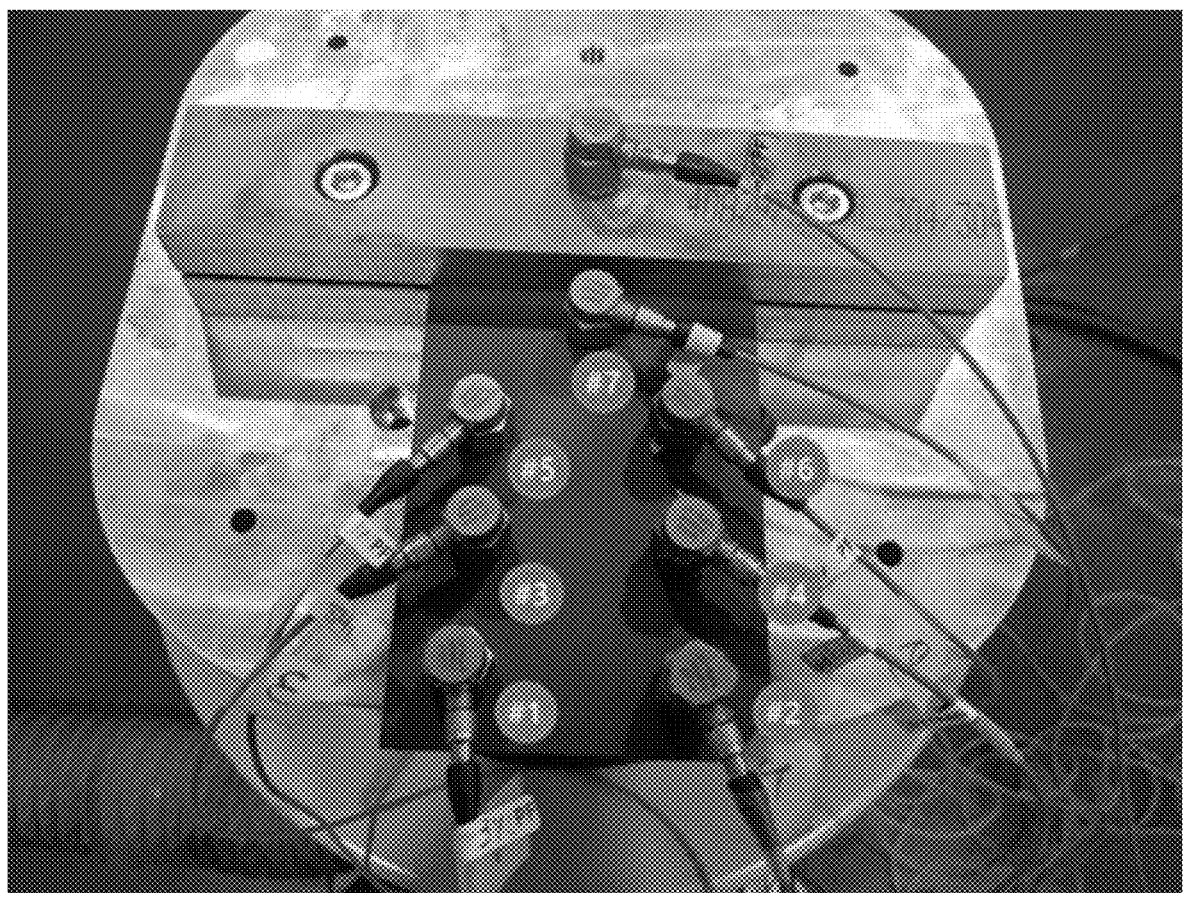

FIG. 4A and FIG. 4B show examples of an experimental configuration of a sensitivity analyzing device.

FIG. 4A shows an example of an experimental configuration using a load sensor as the first sensor 120. FIG. 4B shows an example of an experimental configuration having a multiple of second sensors 130 (#1, #2, #3, . . . , #7) disposed on an opposite face of a test object.

Tables 1 and 2 below show the physical force pattern, that is, the vibration exciting pattern, as applied to the test object 110 by the vibration exciter 140. The vibration exciter 140 may apply a random pattern and a harmonic pattern shown in Tables 1 and 2 to the test object 110.

TABLES 1 and 2

TABLE 1

Profile for random excitation.

| No. | Frequency (Hz) | Acceleration (g²/Hz) |
|---|---|---|
| 1 | 10 | 0.005 |
| 2 | 500 | 0.005 |

TABLE 2

Profile for harmonic excitation.

| No. | Frequency (Hz) | Acceleration (g) |
|---|---|---|
| 1 | 10 | 0.5 |
| 2 | 500 | 0.5 |

Figure 5A:
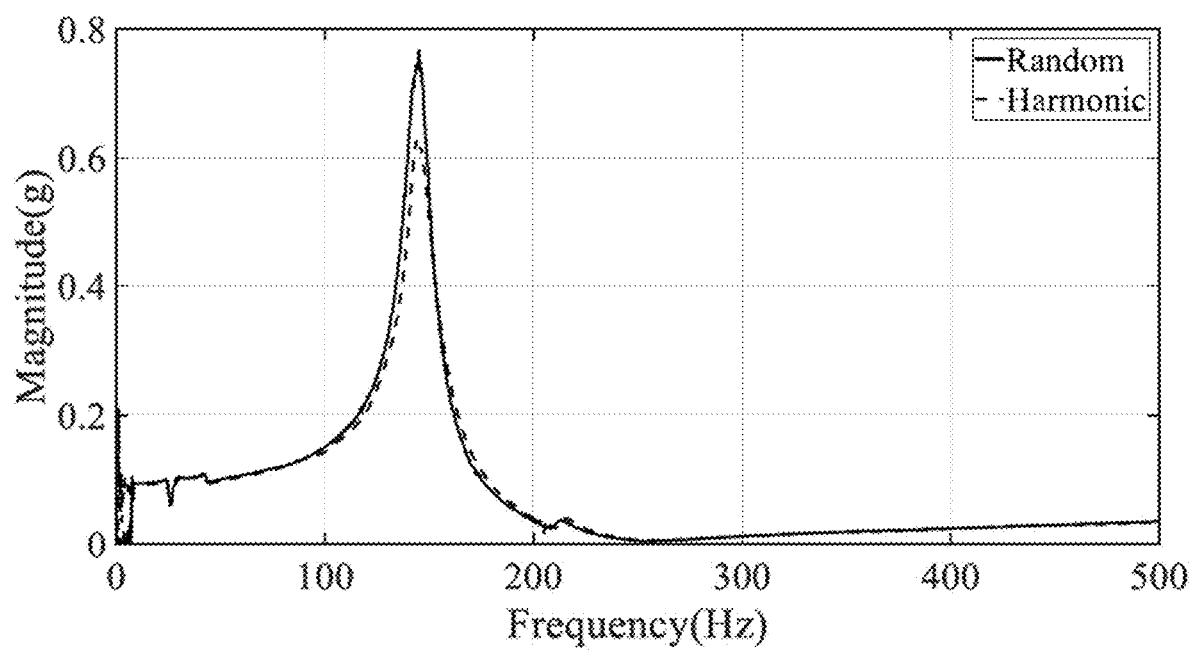
FIG. 5A, FIG. 5B and FIG. 5C show diagrams of frequency response functions of test objects #1, #2, and #3 based on directions.
Figure 5B:
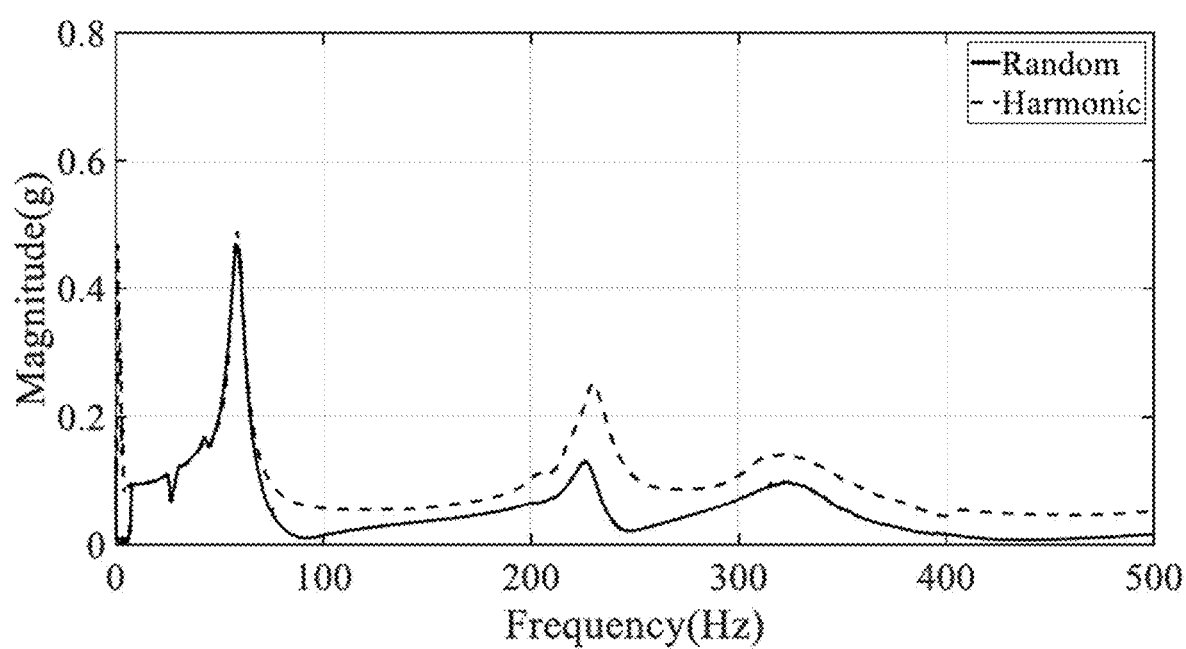
Figure 5C:
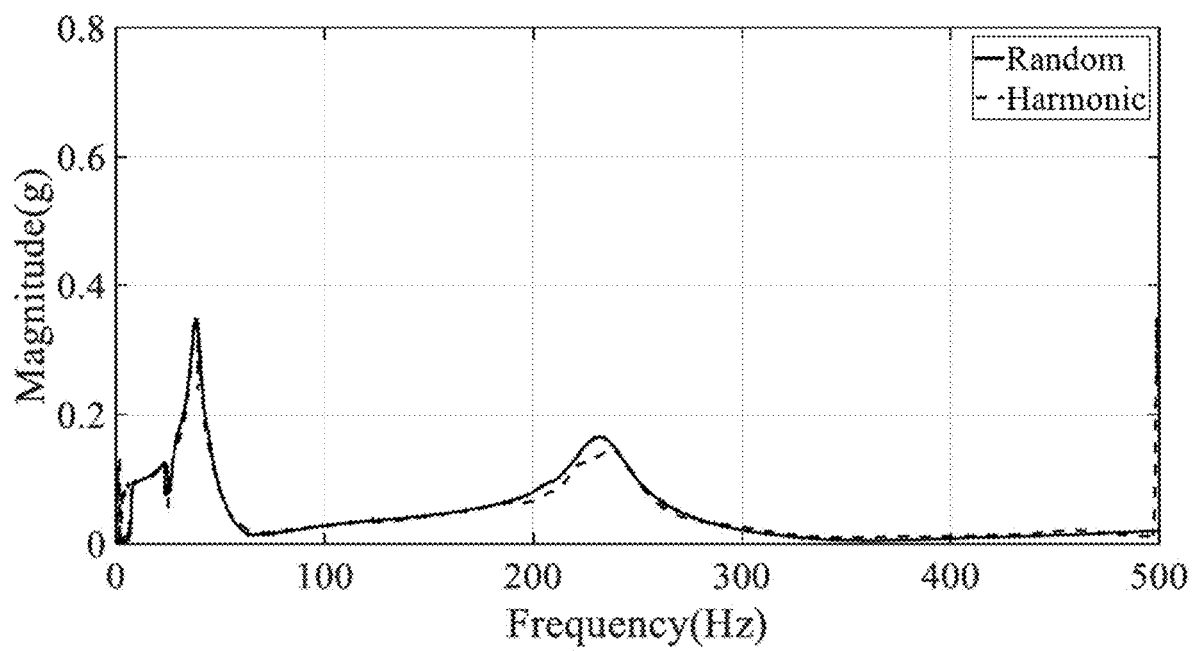

FIG. 5A, FIG. 5B and FIG. 5C show diagrams of frequency response functions of test objects #1, #2, and #3 based on the directions.

When collecting vibrations through the plurality of second sensors 130, the sensitivity analyzer 150 may calculate a frequency response function for each second sensor 130 based on each vibration signal collected by each second sensor 130 and may calculate a frequency response function for the test object 110 by summing the calculated frequency response function values.

FIG. 5A shows a frequency response function of a 1-th carbon fiber reinforced plastic specimen #1 having a carbon fiber orientation angle θ of 0 degree, as calculated by adding the values of the frequency response functions as calculated for the plurality of second sensors 130. FIG. 5A shows a frequency response function of a 2-th carbon fiber reinforced plastic specimen #2 having a carbon fiber orientation angle θ of 45 degree, as calculated by adding the values of the frequency response functions as calculated for the plurality of second sensors 130. FIG. 5C shows a frequency response function of a 3-th carbon fiber reinforced plastic specimen #3 having a carbon fiber orientation angle θ of 90 degree, as calculated by adding the values of the frequency response functions as calculated for the plurality of second sensors 130. A solid line represents a value of the frequency response function when the vibration exciting pattern, that is, the frequency spectrum pattern p is the random pattern, while a dotted line represents a value of the frequency response function when the frequency spectrum pattern p is the harmonic pattern.

Figure 6A:
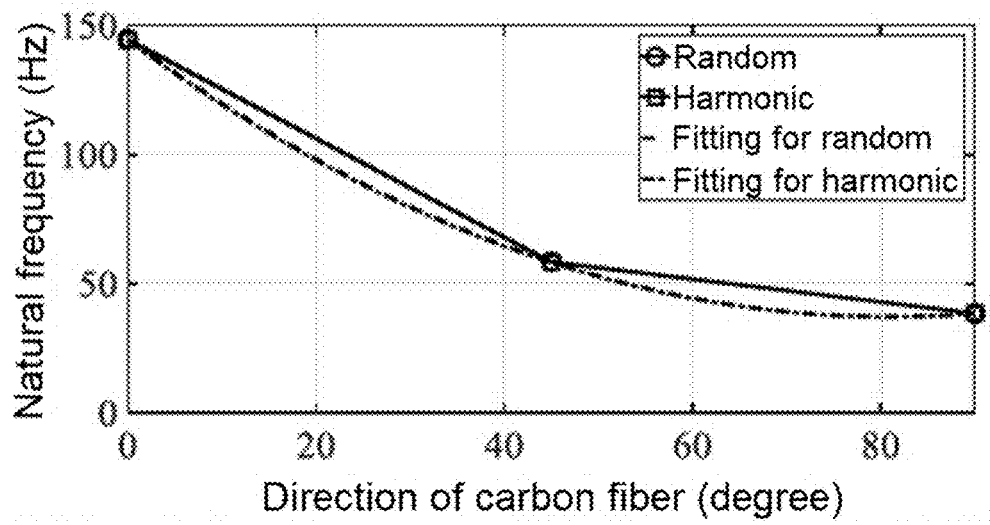
FIG. 6A and FIG. 6B show diagrams of resonance frequencies of a test object based on directions.
Figure 6B:
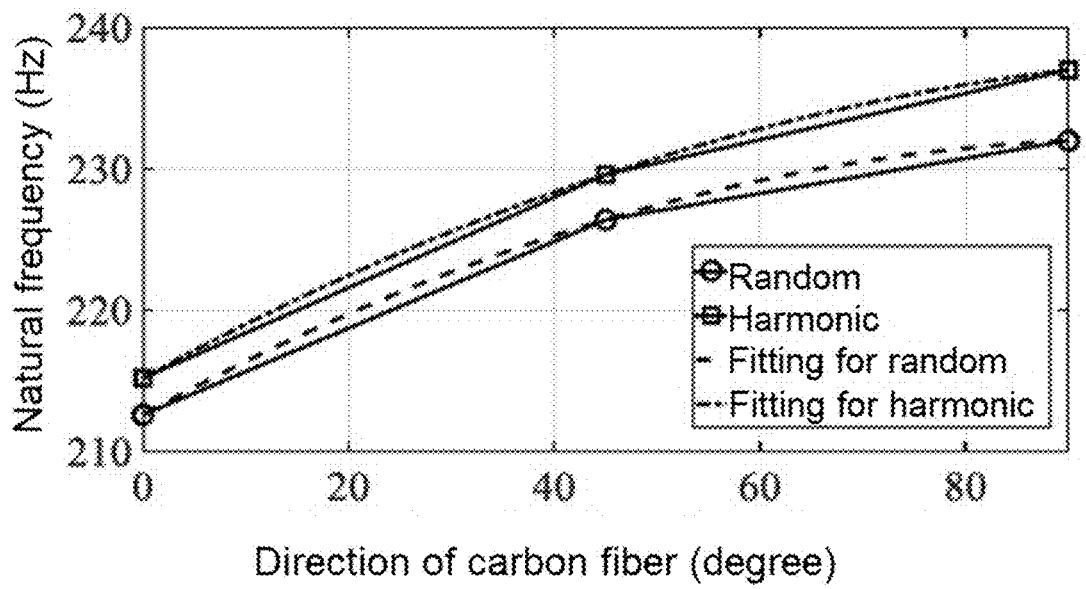
Figure 7A:
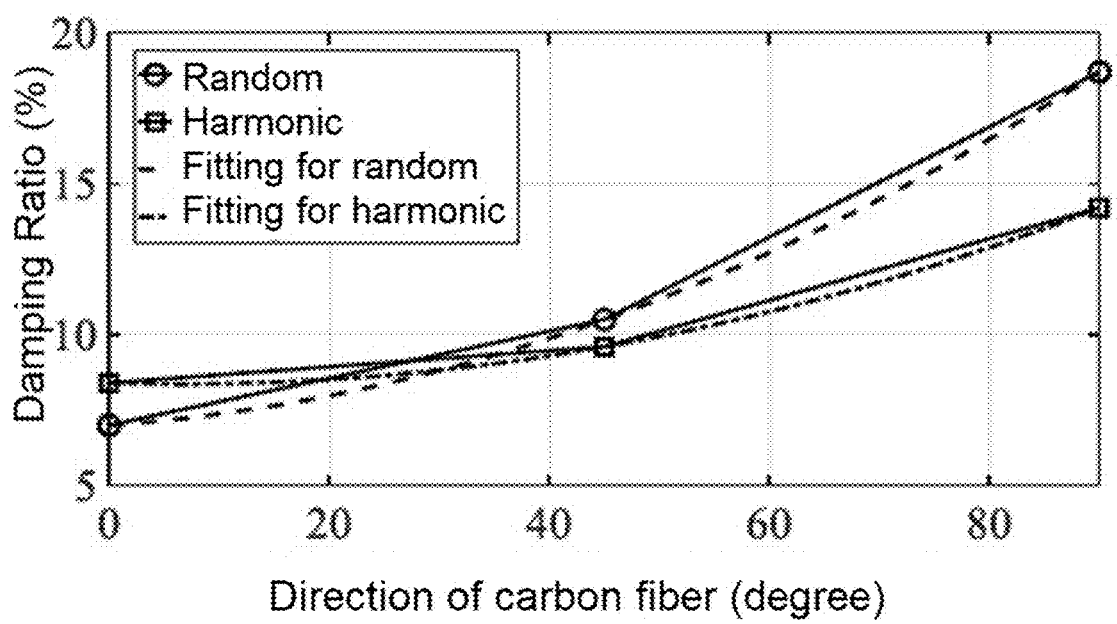
FIG. 7A and FIG. 7B show diagrams of damping ratios of a test object based on directions.
Figure 7B:
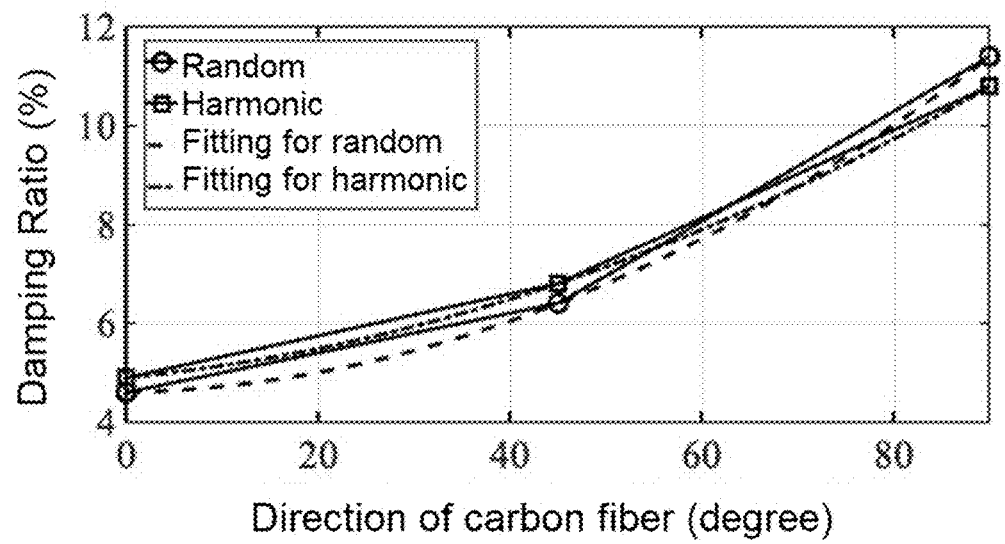

FIG. 6A and FIG. 6B show diagrams of resonance frequencies of a test object based on directions. FIG. 7A and FIG. 7B show diagrams of damping ratios of a test object based on directions.

The sensitivity analyzer 150 may calculate the resonance frequency and the damping ratio for each of the 1-th carbon fiber reinforced plastic specimen #1, the 2-th carbon fiber reinforced plastic specimen #2, and the 3-th carbon fiber reinforced plastic specimen #3 based on values of the frequency response function calculated with reference to FIG. 5A, FIG. 5B and FIG. 5C, and the above Equation 7 and Equation 2. As shown in the figure, the resonance frequency and the damping ratio of each test object may be calculated based on the vibration exciting pattern, that is, the frequency spectrum pattern p. In one embodiment, the sensitivity analyzer 150 may calculate a resonance frequency estimate and a damping ratio estimate for different angles θ using the resonance frequencies and damping ratios calculated for the three carbon fiber reinforced plastic specimens. In one embodiment, the sensitivity analyzer 150 may calculate a function having the three values as coordinates to calculate a resonance frequency estimate and a damping ratio estimate for different orientation angles θ. FIG. 6A and FIG. 6B show resonance frequency estimates for different angles θ. FIG. 7A and FIG. 7B show damping ratio estimates for different angles θ.

The sensitivity analyzer 150 may calculate the sensitivity index based on the angle θ and the sensitivity index based on the frequency spectrum pattern p of the physical force applied to the test object 110 using the above Equation 3 and Equation 2. The sensitivity analyzer 150 may calculate the scaled sensitivity index using the above Equation 4 based on the calculated sensitivity index.

Figure 8:
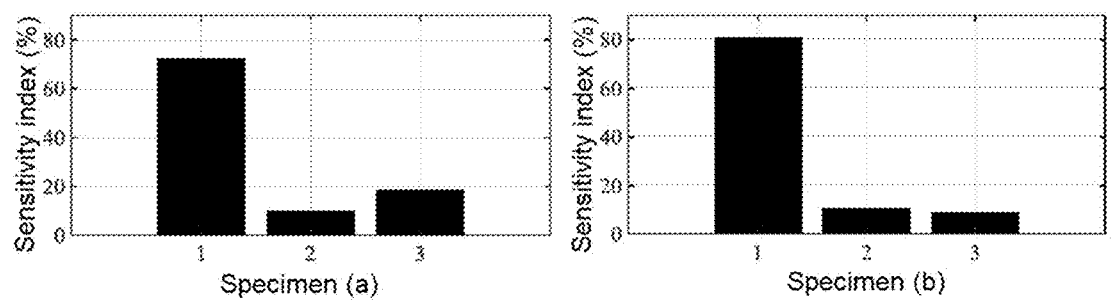
FIG. 8 shows diagrams of a scaled sensitivity index calculated using a first mode frequency response function of test objects #1, #2, and #3 based on vibration exciting patterns.
Figure 9:
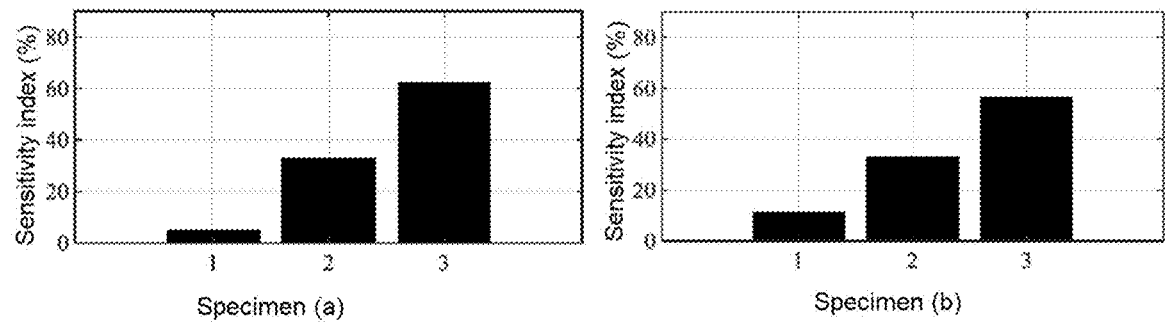
FIG. 9 shows diagrams of a scaled sensitivity index calculated using a second mode frequency response function of test objects #1, #2, and #3 based on vibration exciting patterns.

FIG. 8 shows diagrams of a scaled sensitivity index calculated using a first mode frequency response function of test objects #1, #2, and #3 based on vibration exciting patterns. FIG. 9 shows diagrams of a scaled sensitivity index calculated using a second mode frequency response function of test objects #1, #2, and #3 based on vibration exciting patterns.

Figure 10:
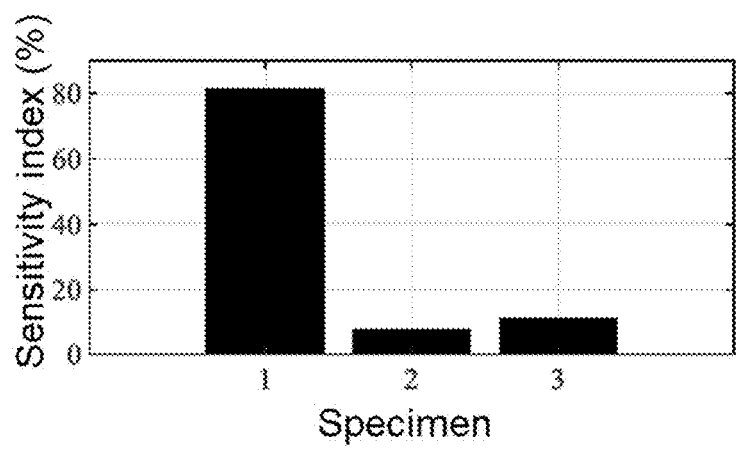
FIG. 10 shows a diagram of a scaled sensitivity index based on a frequency spectrum pattern of test objects #1, #2, and #3.
Figure 11:
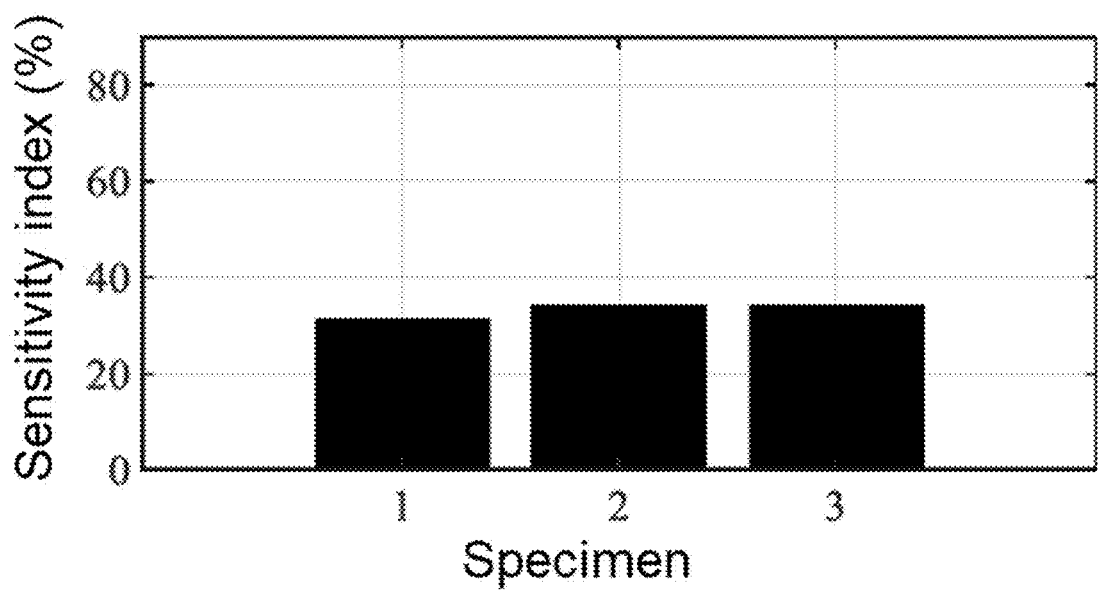
FIG. 11 shows a diagram of a scaled sensitivity index of a damping ratio of test objects #1, #2, and #3.

FIG. 10 shows a diagram of a scaled sensitivity index based on a frequency spectrum pattern of test objects #1, #2, and #3. FIG. 11 shows a diagram of a scaled sensitivity index of a damping ratio of test objects #1, #2, and #3. FIG. 8 to FIG. 11 show the scaled sensitivity index calculated as a percentage for each test object.

Referring to the scaled sensitivity index diagrams of FIGS. 8 to 11, in a first mode, the sensitivity index of the #1 test object (the carbon fiber reinforced plastic specimen having the orientation angle θ of 0 degree of the carbon fiber). As the orientation angle θ of the carbon fiber increases, the sensitivity index rapidly decreases. In the second mode, a trend of the sensitivity index is opposite to that of the first mode.

In the first mode, the sensitivity index based on the frequency spectrum pattern p of the #1 test object (the carbon fiber reinforced plastic specimen having the orientation angle θ of 0 degree of the carbon fiber) is the largest.

Based on the above results, it may be identified that when the external physical force is applied to the test object under the current conditions, the #1 test object (the carbon fiber reinforced plastic specimen having the orientation angle θ of 0 degree of the carbon fiber) has the highest structural rigidity. However, the #1 test object (the carbon fiber reinforced plastic specimen having the orientation angle θ of 0 degree of the carbon fiber) is sensitive to variations in the external physical force applied under current conditions. Therefore, the designer may determine that when the external physical force is applied to the test object under the current conditions, a product made of the #1 test object (the carbon fiber reinforced plastic specimen having the orientation angle θ of 0 degree of the carbon fiber) is the most structurally rigid product. However, the designer should consider, in designing the product, the major factor that the #1 test object (the carbon fiber reinforced plastic specimen having the orientation angle θ of 0 degree of the carbon fiber) is sensitive to variations in the external physical force applied under current conditions.

Referring to the scaled sensitivity index based on the frequency spectrum pattern p in the first mode, the #1 test object (the carbon fiber reinforced plastic specimen having the orientation angle θ of 0 degree of the carbon fiber) has a large scaled sensitivity index based on the frequency spectrum pattern p. However, each of the #2 and #3 test objects (the carbon fiber reinforced plastic specimens having the orientation angle θ of 45 degrees and 90 degrees of the carbon fiber respectively) has a small scaled sensitivity index based on the frequency spectrum pattern p. Thus, the frequency response function value of the #1 test object may be easily changed even due to a small change in the spectrum pattern of the external physical force. In other words, when designing a product using the #1 test object, the designer should consider the major factor that the frequency response function value of the #1 test object may be easily changed even due to a small change in the spectrum pattern of the external physical force. In an embodiment, the sensitivity analyzer 150 may automatically compare the scaled sensitivity index values for the test objects and output the comparison result. For example, as described above, a test object having the highest structural stability among the plurality of test objects when the external physical force is applied thereto under the current test condition may be selected and then the test result thereof may be output.

Figure 12:
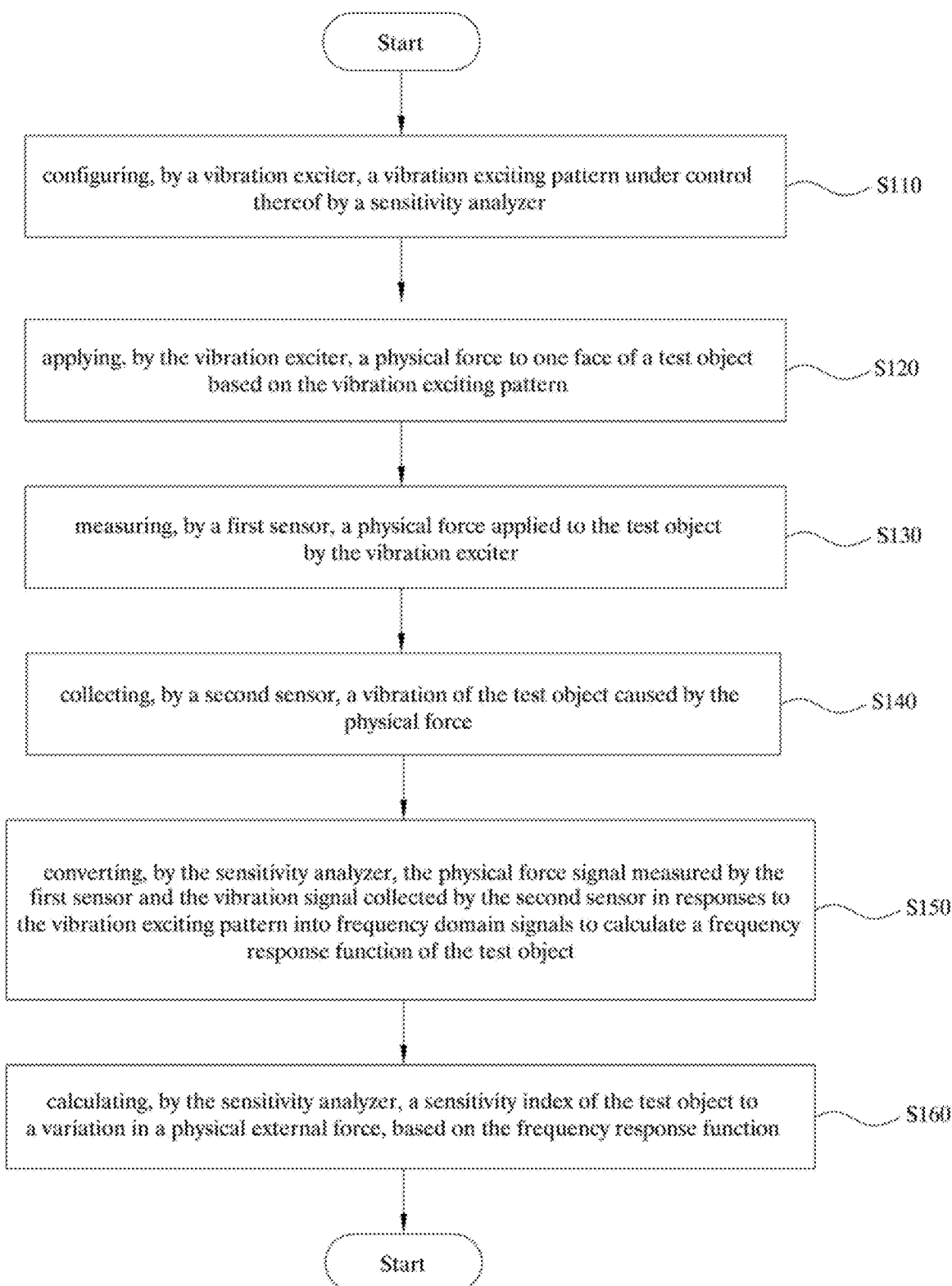
FIG. 12 is a flow chart illustrating a sensitivity analyzing method using a frequency response in accordance with an embodiment of the present disclosure.

FIG. 12 is a flowchart illustrating a sensitivity analyzing method using a frequency response in accordance with an embodiment of the present disclosure.

Referring to FIG. 12, in the sensitivity analysis method using the frequency response, the sensitivity analyzer 150 controls the vibration exciter 140 to configure the vibration exciting pattern (step S1210).

When the vibration exciter 140 applies a physical force to one face of the test object 110 under control of the sensitivity analyzer 150 (step S1220), the first sensor 120 measures the physical force applied to the test object 110 by the vibration exciter 140 (step S1230). The second sensor 130 collects the vibration of the test object 110 caused by the physical force (step S1240).

In one embodiment, the vibration exciter 140 applies a physical force based on at least two or more vibration exciting patterns. The vibration exciting pattern includes a random pattern and a harmonic pattern having the same frequency band.

The sensitivity analyzer 150 may convert the physical force signal measured by the first sensor 120 and the vibration signal collected by the second sensor 130 into a frequency domain signal to calculate a frequency response function of the test object 110 (step S1250).

In one embodiment, the sensitivity analyzer 150 may calculate the frequency response function based on the frequency spectrum pattern of the physical force applied to the test object 110 and the oriented angle of the material. For example, the sensitivity analyzer 150 may calculate the frequency response function using the above Equation 8.

The sensitivity analyzer 150 may calculate the sensitivity index of the test object 110 to the variation in a physical external force based on the calculated frequency response function (step S1260).

In one embodiment, the sensitivity analyzer 150 may calculate a sensitivity index based on the frequency spectrum p pattern of the physical force applied to the test object 110, and may calculate the sensitivity index based on the angle θ. In one embodiment, the sensitivity analyzer 150 may calculate the sensitivity index based on the angle θ using the above Equation 11, and may use the above Equation 12 to calculate the sensitivity index based on the frequency spectrum pattern p.

The sensitivity analyzer 150 may calculate the sensitivity index of each of at least two test objects having different angles at which the material is oriented, based on the frequency spectrum pattern p of the physical force applied thereto. The sensitivity analyzer 150 may calculate the sensitivity index of each of at least two test objects having different angles at which the material is oriented, based on the angle θ. The sensitivity analyzer 150 may calculate each scaled sensitivity index for each test object based on each of the sensitivity index based on the frequency spectrum pattern p and the sensitivity index based on the angle θ as calculated for each test object. In one embodiment, the sensitivity analyzer 150 may calculate each scaled sensitivity index for each test object using the above Equation 4.

The sensitivity analyzing device using the frequency response illustrated in FIGS. 1 to 11 and the sensitivity analyzing method using the same illustrated in FIG. 12 may be implemented using an application or a module composed of computer executable instructions as executed by a computer. A computer-readable medium may store therein the computer executable instructions.

The computer-readable media may be any available media that may be accessed by a computer, and may include both volatile and nonvolatile media, and both removable and non-removable media. Further, the computer readable media may include computer storage media and communication media. The computer storage media may include all of volatile and nonvolatile, and removable and non-removable media implemented in any method or scheme for storage of information such as computer readable instructions, data structures, modules or other data. The communication media may typically include computer readable instructions, data structures, program modules, or other data such as a modulated data signal such as a carrier wave, or other transmission mechanism, and may include any information transmission medium.

The module may refer to hardware capable of performing functions and operations as illustrated in the present disclosure and may mean computer program codes that may perform certain functions and operations. Further, the module may mean an electronic recording medium, for example, a processor, on which computer program codes capable of performing specific functions and operations are mounted.

The embodiments of the present disclosure have been described above but a technical spirit of the present disclosure is not limited to the embodiments. Various sensitivity analyzing devices using a frequency response and various sensitivity analyzing methods using the same may be implemented within the scope of the present disclosure.

What is claimed is:

1. A sensitivity analyzing device using frequency response, the device comprising:
   a vibration exciter configured to configure a vibration exciting pattern and apply a physical force to one face of a test object based on the vibration exciting pattern;
   a first sensor in contact with the one face of the test object to measure a physical force applied to the test object by the vibration exciter;
   a second sensor in contact with an opposite face of the test object to the one face to collect a vibration of the test object caused by the physical force; and
   a sensitivity analyzer configured to:
     control the vibration exciter to configure the vibration exciting pattern;
     convert the physical force signal measured by the first sensor and the vibration signal collected by the second sensor in responses to the vibration exciting pattern into frequency domain signals to calculate a frequency response function of the test object; and
     calculate a sensitivity index of the test object to a variation in a physical external force, based on the frequency response function, wherein the test object is made of a material having a single orientation of a predefined angle, and
   wherein the sensitivity analyzer is configured to calculate the frequency response function based on a frequency spectrum pattern of the physical force applied to the test object and the orientation angle of the material thereof, or wherein the sensitivity analyzer is configured to calculate the sensitivity index based on the frequency spectrum pattern of the physical force applied to the test object and an orientation sensitivity index based on the orientation angle.

2. The sensitivity analyzing device of claim 1, wherein the vibration exciter is configured to apply the physical force based on at least two vibration exciting patterns, wherein the at least two vibration exciting pattern include a random pattern and a harmonic pattern having the same frequency band.

3. The sensitivity analyzing device of claim 1, wherein the vibration exciter includes an actuator, an electrodynamic shaker or an impact hammer.

4. The sensitivity analyzing device of claim 1, wherein the first sensor includes a load sensor positioned between the vibration exciter and the test object to measure the physical force.

5. The sensitivity analyzing device of claim 1, wherein the second sensor includes an acceleration sensor.

6. The sensitivity analyzing device of claim 1, wherein the test object is made of a carbon fiber reinforced plastic (CFRP) having carbon fibers as a reinforced material.

7. The sensitivity analyzing device of claim 1, wherein the sensitivity analyzer is configured to calculate the frequency response function based on the frequency spectrum pattern of the physical force applied to the test object and the orientation angle of the material thereof.

8. The sensitivity analyzing device of claim 7, wherein the sensitivity analyzer is configured to calculate the frequency function using a following Equation 1:

$$H(\omega, \theta, p) = \sum_{i=1}^{N} \frac{R_i^e}{-\omega^2 + 2\omega_{n,i}(\theta)\omega\xi_i(\theta, p)j + \omega_{n,i}(\theta)^2} \quad \text{[Equation 1]}$$

where $H(\omega, \theta, p)$ denotes the frequency response function, θ denotes the orientation angle, p denotes the frequency spectrum, $\omega_{n,i}(\theta)$ denotes a resonance frequency, $\xi_i(p, \theta)$ denotes a damping ratio, $R_i^e$ denotes an i-th mode residue, and ω denotes a frequency (=2πf).

9. The sensitivity analyzing device of claim 1, wherein the sensitivity analyzer is configured to calculate the sensitivity index based on the frequency spectrum pattern of the physical force applied to the test object and the orientation sensitivity index based on the orientation angle.

10. The sensitivity analyzing device of claim 9, wherein the sensitivity analyzer is configured to calculate the sensitivity index based on the frequency spectrum pattern of the physical force based on a following Equation 2:

$$I_{p,i}(k) = \left| \frac{0.5}{H(\omega, \theta, p)} \frac{\partial(H(\omega, \theta, p))}{\partial p} \right| = \left| \omega\omega_{n,i}(\theta) \frac{\partial(\xi_i(\theta, p))}{\partial p} \right| \quad \text{[Equation 2]}$$

where
- p denotes the frequency spectrum pattern,
- $I_{p,i}(k)$ denotes the sensitivity index based on the frequency spectrum pattern for an i-th mode frequency response function of a k-th test object specimen,
- $H(\omega, \theta, p)$ denotes the frequency response function,
- θ denotes the orientation angle,
- p denotes the frequency spectrum pattern,
- $\omega_{n,i}(\theta)$ denotes a resonance frequency,
- $\xi_i(p, \theta)$ denotes a damping ratio, and
- ω denotes a frequency (=2πf).

11. The sensitivity analyzing device of claim 9, wherein the sensitivity analyzer is configured to calculate the sensitivity index based on the angle using a following Equation 3:

$$I_{\theta,i}(k) = \left| \frac{0.5}{H(\omega, \theta, p)} \frac{\partial (H(\omega, \theta, p))}{\partial \theta} \right| = \left| \omega_{n,i}(\theta) \frac{\partial (\omega_{n,i}(\theta))}{\partial \theta} + \omega \left( \xi_i(\theta, p) \frac{\partial (\omega_{n,i}(\theta))}{\partial \theta} + \omega_{n,i}(\theta) \frac{\partial (\xi_i(\theta, p))}{\partial \theta} \right) j \right|$$ [Equation 3]

where
- θ denotes the orientation angle,
- $I_{e,i}(k)$ denotes the sensitivity index based on the angle for an i-th mode frequency response function of a k-th test object specimen,
- $H(\omega, \theta, p)$ denotes the frequency response function,
- p denotes the frequency spectrum pattern,
- $\omega_{n,i}(\theta)$ denotes a resonance frequency,
- $\xi_i(p, \theta)$ denotes a damping ratio, and
- ω denotes a frequency (=2πf).

12. The sensitivity analyzing device of claim 9, wherein the sensitivity analyzer is configured to:
- calculate a first sensitivity index of each of at least two test objects having different orientation angles of the material, based on a frequency spectrum pattern of the physical force applied thereto;
- calculate a second sensitivity index of each of the at least two test objects, based on the orientation angle; and
- calculate first and second scaled sensitivity indexes of each of the at least two test objects, based on the first and second sensitivity indexes of each test object respectively.

13. The sensitivity analyzing device of claim 12, wherein in case the number of the test object is 3, the sensitivity analyzer is configured to calculate the first and second scaled sensitivity indexes of each test object based on a following Equation 4:

$$\tilde{I}_{\theta,i} = \frac{I_{\theta,i}(k)}{\sum_{k=1}^{3} I_{\theta,i}(k)}$$

$$\tilde{I}_{p,i} = \frac{I_{p,i}(k)}{\sum_{k=1}^{3} I_{p,i}(k)}$$ [Equation 4]

where
- θ denotes the orientation angle,
- p denotes the frequency spectrum pattern,
- $\tilde{I}_{\theta,i}$ denotes the second scaled sensitivity index based on the angle θ,
- $\tilde{I}_{p,i}$ denotes the first scaled sensitivity index based on the frequency spectrum pattern p,
- $I_{e,i}(k)$ denotes the sensitivity index based on the angle for an i-th mode frequency response function of a k-th test object specimen, and
- $I_{p,i}(k)$ denotes the sensitivity index based on the frequency spectrum for an i-th mode frequency response function of a k-th test object specimen.

14. A sensitivity analyzing method using frequency response, the method comprising:
- configuring, by a vibration exciter, a vibration exciting pattern under control thereof by a sensitivity analyzer;
- applying, by the vibration exciter, a physical force to one face of a test object based on the vibration exciting pattern;
- measuring, by a first sensor, a physical force applied to the test object by the vibration exciter;
- collecting, by a second sensor, a vibration of the test object caused by the physical force;
- converting, by the sensitivity analyzer, the physical force signal measured by the first sensor and the vibration signal collected by the second sensor in responses to the vibration exciting pattern into frequency domain signals to calculate a frequency response function of the test object; and
- calculating, by the sensitivity analyzer, a sensitivity index of the test object to a variation in a physical external force, based on the frequency response function,
- wherein the test object is made of a material having a single orientation of a predefined angle, and
- wherein calculating the frequency response function includes calculating the frequency response function based on a frequency spectrum pattern of the physical force applied to the test object and the orientation angle of the material thereof, or wherein calculating the sensitivity index includes calculating the sensitivity index based on the frequency spectrum pattern of the physical force applied to the test object and an orientation sensitivity index based on the orientation angle.

15. The sensitivity analyzing method of claim 14, wherein applying the physical force includes applying the physical force based on at least two vibration exciting patterns, wherein the at least two vibration exciting pattern include a random pattern and a harmonic pattern having the same frequency band.

16. The sensitivity analyzing method of claim 14, wherein calculating the frequency response function includes calculating the frequency response function based on the frequency spectrum pattern of the physical force applied to the test object and the orientation angle of the material thereof.

17. The sensitivity analyzing method of claim 16, wherein calculating the frequency response function includes calculating the frequency function using a following Equation 1:

$$H(\omega, \theta, p) = \sum_{i=1}^{N} \frac{R_i^e}{-\omega^2 + 2\omega_{n,i}(\theta)\omega\xi_i(\theta, p)j + \omega_{n,i}(\theta)^2}$$ [Equation 1]

where $H(\omega, \theta, p)$ denotes the frequency response function, θ denotes the orientation angle, p denotes the frequency spectrum, $\omega_{n,i}(\theta)$ denotes a resonance frequency, $\xi_i(p, \theta)$ denotes a damping ratio, $R_i^e$ denotes an i-th mode residue, and ω denotes a frequency (=2πf).

18. The sensitivity analyzing method of claim 14, wherein calculating the sensitivity index includes calculating a sensitivity index based on a frequency spectrum pattern of the physical force applied to the test object and a sensitivity index based on the orientation angle.

19. The sensitivity analyzing method of claim 18, wherein calculating the sensitivity index based on the frequency spectrum pattern of the physical force includes calculating the sensitivity index based on the frequency spectrum pattern of the physical force based on a following Equation 2:

$$I_{p,i}(k) = \left| \frac{0.5}{H(\omega, \theta, p)} \frac{\partial(H(\omega, \theta, p))}{\partial p} \right| = \left| \omega \omega_{n,i}(\theta) \frac{\partial(\xi_i(\theta, p))}{\partial p} \right| \quad \text{[Equation 2]}$$

where
   p denotes the frequency spectrum pattern,
   $I_{p,i}(k)$ denotes the sensitivity index based on the frequency spectrum pattern for an i-th mode frequency response function of a k-th test object specimen,
   $H(\omega, \theta, p)$ denotes the frequency response function,
   $\theta$ denotes the orientation angle,
   p denotes the frequency spectrum pattern,
   $\omega_{n,i}(\theta)$ denotes a resonance frequency,
   $\xi_i(p, \theta)$ denotes a damping ratio, and
   $\omega$ denotes a frequency ($=2\pi f$).

20. The sensitivity analyzing method of claim 18, wherein calculating the sensitivity index based on the angle includes calculating the sensitivity index based on the angle using a following Equation 3:

$$I_{\theta,i}(k) = \left| \frac{0.5}{H(\omega, \theta, p)} \frac{\partial(H(\omega, \theta, p))}{\partial \theta} \right| = \left| \omega_{n,i}(\theta) \frac{\partial(\omega_{n,i}(\theta))}{\partial \theta} + \omega \left( \xi_i(\theta, p) \frac{\partial(\omega_{n,i}(\theta))}{\partial \theta} + \omega_{n,i}(\theta) \frac{\partial(\xi_i(\theta, p))}{\partial \theta} \right) j \right| \quad \text{[Equation 3]}$$

where
   $\theta$ denotes the orientation angle,
   $I_{\theta,i}(k)$ denotes the sensitivity index based on the angle for an i-th mode frequency response function of a k-th test object specimen,
   $H(\omega, \theta, p)$ denotes the frequency response function,
   p denotes the frequency spectrum pattern,
   $\omega_{n,i}(\theta)$ denotes a resonance frequency,
   $\xi_i(p, \theta)$ denotes a damping ratio, and
   $\omega$ denotes a frequency ($=2\pi f$).

21. The sensitivity analyzing method of claim 14, wherein the method further comprises:
   calculating a first sensitivity index of each of at least two test objects having different orientation angles of the material, based on a frequency spectrum pattern of the physical force applied thereto;
   calculating a second sensitivity index of each of the at least two test objects, based on the orientation angle; and
   calculating first and second scaled sensitivity indexes of each of the at least two test objects, based on the first and second sensitivity indexes of each test object respectively.

22. The sensitivity analyzing method of claim 21, wherein in case the number of the test object is 3, calculating the first and second scaled sensitivity indexes of each of the at least two test objects calculating the first and second scaled sensitivity indexes of each test object based on a following Equation 4:

$$\tilde{I}_{\theta,i} = \frac{I_{\theta,i}(k)}{\sum_{k=1}^{3} I_{\theta,i}(k)} \quad \text{[Equation 4]}$$

$$\tilde{I}_{p,i} = \frac{I_{p,i}(k)}{\sum_{k=1}^{3} I_{p,i}(k)}$$

where
   $\theta$ denotes the orientation angle,
   p denotes the frequency spectrum pattern,
   $\tilde{I}_{\theta,i}$ denotes the second scaled sensitivity index based on the angle $\theta$,
   $\tilde{I}_{p,i}$ denotes the first scaled sensitivity index based on the frequency spectrum pattern p,
   $I_{\theta,i}(k)$ denotes the sensitivity index based on the angle for an i-th mode frequency response function of a k-th test object specimen, and
   $I_{p,i}(k)$ denotes the sensitivity index based on the frequency spectrum for an i-th mode frequency response function of a k-th test object specimen.

\* \* \* \* \*